United States Patent [19]

Nakagawa

[11] Patent Number: 5,514,498
[45] Date of Patent: May 7, 1996

[54] RETICLE WITH PHASE-SHIFTERS AND A METHOD OF FABRICATING THE SAME

[75] Inventor: Kenji Nakagawa, Isehara, Japan

[73] Assignee: Fujitsu Limited, Kawasaki, Japan

[21] Appl. No.: 138,002

[22] Filed: Oct. 19, 1993

Related U.S. Application Data

[62] Division of Ser. No. 716,987, Jun. 18, 1991, Pat. No. 5,276,551.

Foreign Application Priority Data

Jun. 20, 1990 [JP] Japan ..................................... 2-163434

[51] Int. Cl.$^6$ .......................................................... G03F 9/00
[52] U.S. Cl. ................................ 430/5; 430/311; 430/312; 430/313; 430/314; 156/643.1; 156/646.1
[58] Field of Search ............................... 430/5, 314, 313, 430/312, 311; 156/643, 646

References Cited

U.S. PATENT DOCUMENTS

| | | | |
|---|---|---|---|
| 3,547,546 | 12/1970 | Schier | 350/162 |
| 4,530,736 | 7/1985 | Mutter | 156/643 |
| 4,737,447 | 4/1988 | Suzuki et al. | 430/321 |
| 5,045,417 | 9/1991 | Okamoto | 430/5 |

FOREIGN PATENT DOCUMENTS

| | | |
|---|---|---|
| 0383534 | 8/1990 | European Pat. Off. |
| 0395425 | 10/1990 | European Pat. Off. |

*Primary Examiner*—S. Rosasco
*Attorney, Agent, or Firm*—Staas & Halsey

[57] ABSTRACT

A reticle and a method of fabricating the same for projecting a fine pattern on an object surface comprises: a transparent substrate; a first type phase-shifter selectively patterned and deposited on the substrate producing a phase difference between the light passing therethrough and the light passing through the other areas without phase-shifter; and a second type phase-shifter selectively patterned and forming a groove in the substrate producing a phase difference between the light passing therethrough and the light passing through the other areas without phase-shifter. The reticle may include a patterned shield layer which interrupts transmission of light, and the phase difference of the first and second type phase-shifters is many times selected substantially equal to a half wavelength of light. Another type of a reticle comprises: a transparent substrate; a phase-shifter of a first groove; and another phase-shifter of a second deeper groove formed in the first groove.

17 Claims, 8 Drawing Sheets

RETICLE WITH PHASE-SHIFTERS AND A METHOD OF FABRICATING THE SAME

This application is a division of application Ser. No. 07/716,987, filed Jun. 18, 1991, now U.S. Pat. No. 5,276,551.

BACKGROUND OF THE INVENTION

1. Field of the Invention

This invention relates to a reticle used for projecting a very fine pattern on a semiconductor substrate in photolithography and, more particularly, to a reticle into which phase-shifters are incorporated and to a method of fabricating the reticle with the phase-shifters.

With a trend toward higher integration of an integrated circuit, patterns formed on a semiconductor substrate in photolithography are required to be ever finer and more precise. A reticle having phase-shifters is one of the solutions therefor.

2. Description of the Related Art

It is known that a magnified pattern with a magnification ratio of about 1 to 10 is formed on a reticle and the reticle pattern is projected forming a reduced real image on a semiconductor substrate by a step and repeat method using a so-called stepper.

When dimensions constituting the pattern on the semiconductor substrate are reduced to submicron order, there arises a problem in that two lights which penetrate through two adjacent transparent portions of the reticle pattern, the two portions being separated by a narrow strip portion, interfere with each other, and accurate strip pattern is not projected and formed on the semiconductor substrate.

In order to solve the interference problem between the two adjacent lights, a phase-shifter technique has been introduced into the reticle fabrication process.

Typical known reticle structures with phase-shifters are described herein. FIG. 1 shows a cross section of a known reticle structure with phase-shifters. On a reticle substrate 1 manufactured of glass or quartz, light-shielding layer 2 and 2' containing the pattern to be projected onto the substrate (hereinafter abbreviated as shield layer), generally of a chromium (Cr) or a chromium compound, is formed by a conventional method. Of the two adjacent openings 30 and 31, one opening 31 between shield layers 2 and 2' is covered with a phase-shift layer 3 (hereinafter abbreviated as phase-shifter) which has a function of improving the resolution in photolithography.

The lights 33 and 34 impinging on the bottom surface of the reticle and traveling a distance t, undergo a different phase shift due to an existence of the phase-shift layer 3 (in an actual case, the reticle is arranged upside down in the stepper). When a thickness of the phase-shift layer is properly selected, two lights passing through the reticle can be made to have an opposite phase (phase-shift of $\pi$) to each other. This results in forming a distinct image pattern of the middle Cr layer 2' on the semiconductor substrate because the adverse effects from the adjacent lights from both sides are eliminated.

FIG. 2 shows a cross section of another known reticle structure with phase-shifters. In the same way as in FIG. 1, a pattern of light-shielding layers 2 are formed on a glass substrate 1. However, in this case, a phase-shifter 3' has the shape of a groove or well formed under a window 31 between the two adjacent light-shielding layers 2 and 2'. The groove is formed by subjecting the substrate 1 to a conventional unisotropic etching process such as RIE (Reactive Ion Etching), in which only the substrate surface for the area where the groove is to be formed is exposed and the remaining areas are covered with a resist layer. The function of the phase-shifter 3' is almost the same as the phase-shifter 3 of FIG. 1. However, in this case, the light 33 traveling a distance d within the substrate causes a phase difference of $\pi$ from the light 34 which travels the same distance d through the groove without substrate material.

With a reticle with phase-shifters, fine complicated patterns are formed on a semiconductor substrate. However, the process of fabricating a reticle, defects are often formed in the patterns of shield layer 2 or phase-shifters 3. In addition, though a reticle with phase-shifters has been completed, it may be required that a small portion of the pattern needs to be modified or changed. Therefore, it is important that the reticle pattern can be repaired or modified.

When it is found that the shield layer 2 includes a missing portion or void portion, or an unnecessary extra portion in its pattern before forming phase-shifters, these defect portions are comparatively easily repaired using a Focused Ion Beam (hereinafter abbreviated as FIB) apparatus.

When the phase-shifter 3 is formed and includes a missing portion or an unnecessary extra portion in its pattern, the extra portion can be removed using the above FIB apparatus and the reticle can be repaired. However, if the defect is a missing portion in the phase-shifter pattern, the reticle can not be repaired easily.

The FIB apparatus will be briefly described. FIG. 3 shows a schematic cross section of the FIB apparatus. Ions are emitted from an ion gun 6, and gallium (Ga) ions are popularly used therein. The emitted ions are focused by a condenser lens 7 and further on-off controlled by a blanking electrode 8 and a blanking aperture 9. An object lens 10 and a deflection lens 11 have the function of focusing and projecting an ion beam onto an object 14 to be processed at a specified scanning position. The object can be moved by an XY-table 15. The ion beam can sputter-and-etch the object, and a secondary ion detector 12 can detect the object and identify the ion beam position. When a gas is introduced from a gas injection gun 13, the ion beam resolves or seperates the gas, and the resolved elements or components can be deposited on the object 14.

In order to remove the unnecessary extra portion of the shield layer 2 or the phase shifter 3, the unnecessary portion is subjected to irradiation of the above ion beam by moving the XY-table and scanning the ion beam. However, when the phase-shifter 3 of FIG. 1 has a missing portion, or when the groove-shaped phase-shifter 3' of FIG. 2 includes an extra groove portion which should not have been taken away, the process of depositing phase-shifter material or substrate material and repairing the void or missing portion of the phase-shifters is very difficult. The reason is that the thickness of phase-shifter 3 and depth of phase-shifter 3' is too large or deep a few thousands angstroms) to bury or fill the void portion using the FIB apparatus. Even if silicon dioxide, which is a popular material for a phase-shifter, is deposited by the FIB apparatus, the deposited phase-shifter contains gallium. Since the gallium containing silicon dioxide is not transparent, silicon dioxide does not work as a phase-shifter.

SUMMARY OF THE INVENTION

It is a general object of the invention, therefore, to provide a reticle which comprises at least two types of phase-shifters i.e., the phase-shift layer and the phase-shift groove.

It is a more specific object of the invention to provide a reticle with phase-shifters which can easily meet a requirement of a small pattern change after completion of reticle fabrication.

It is another object of the invention to provide a reticle with phase-shifters which can easily be repaired from any pattern defect.

It is still another object of the invention to provide a method of fabricating the above reticle with phase-shifters.

It is a further object of the invention to provide a method of repairing the pattern of the above reticle with phase-shifters.

The foregoing and related objects are accomplished by the invention of a reticle comprising: a transparent substrate; a first type phase-shifter selectively patterned and deposited on the substrate producing a phase difference between the light passing through the deposited phase-shifter and the light passing through the other areas which do not contain a phase-shifter; and a second type phase-shifter selectively patterned and forming a groove in the substrate producing a phase difference between the light passing through the grooved phase-shifter and the light passing through the other areas of the substrate without a phase-shifter. The reticle may further include a patterned shield layer which interrupts or prevents transmission of light. In addition, the phase difference between the first and second type phase-shifters is many times selected substantially equal to a half wavelength of light.

Another type of a reticle of the present invention comprises: a transparent substrate; a first phase-shifter selectively patterned and forming a first groove in the substrate producing a first phase difference between the light passing through the first groove and the light passing through the other areas of the substrate without phase-shifters; and a second phase-shifter selectively patterned and formed within the region of the first groove, forming a second deeper groove producing a second phase difference between the light passing through the second groove and the light passing through the first groove.

A method according to fabricating a reticle of the present invention, comprising a groove shaped phase-shifter, can be preferably achieved by utilizing a Focused Ion Beam apparatus, wherein a halogen containing gas is injected onto the groove forming region through a gas injection gun provided with the apparatus and at the same time the groove forming region is subjected to ion beam irradiation.

Details of these variations will become clear from a reading of the detailed description of the invention with reference to the drawings.

BRIEF DESCRIPTION OF THE DRAWINGS

FIGS. 4(a) and 4(b) show a top view of a shield layer and a phase-shifter formed on a reticle substrate, wherein FIG. 4(a) shows a case where the correct pattern is formed, and FIG. 4(b) shows that the shield layer has defects.

The same reference numerals designate the same or corresponding parts throughout the drawings.

DETAILED DESCRIPTION OF THE PREFERRED EMBODIMENTS (1) First Embodiment

Details of a first embodiment of the present invention are disclosed referring to FIGS. 4(a) and 4(b), and FIGS. 5(a) through 5(d).

Figure 4A:
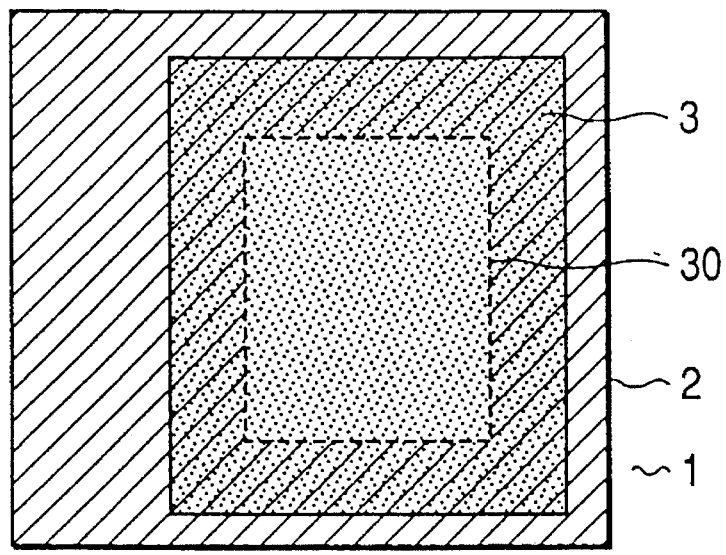

FIG. 4(a) shows a portion of a top view of a reticle with phase-shifters having a correct pattern of a shield layer 2 which has a rectangular outline and a rectangular opening 30. The shield layer 2 is formed by depositing a Cr layer having a thickness of 600 to 800 angstroms which is subsequently patterned by a conventional photolithography technique. The first embodiment utilizes a positive type phase-shifter 3, therefore, the phase-shifter 3 is formed by depositing a silicon dioxide ($SiO_2$) layer, and thereafter the $SiO_2$ layer is patterned. A thickness of the phase-shifter 3 is about 3900 angstroms when an ion beam is used in the stepper. The thickness of the phase-shifter 3 is much larger than that of the shield layer 2.

Figure 4B:
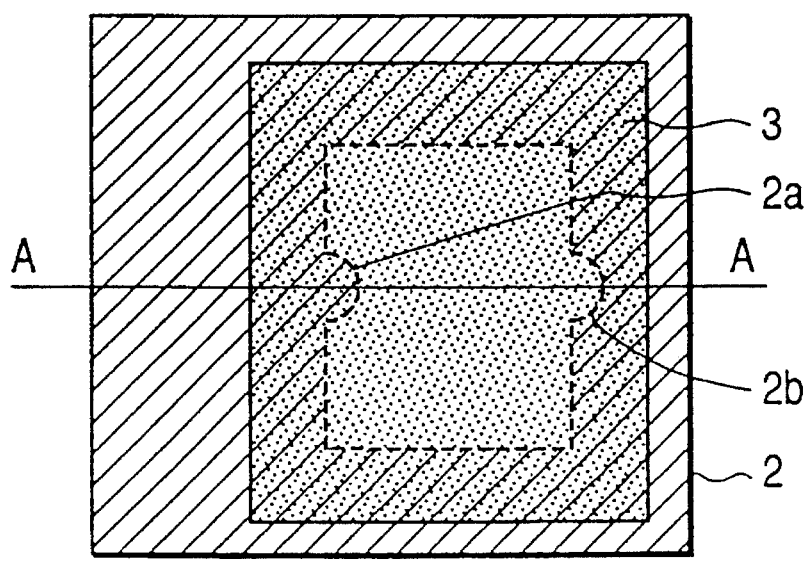

FIG. 4(b) shows a similar top view of the reticle with phase-shifters as FIG. 4(a), however in this case, the shield layer 2 has defective portions 2a and 2b. The portion 2a is an extra protrusion and the portion 2b is a missing portion, both being transformed from the normally straight line periphery of the shield layer. The shapes of defects in the figure are quite schematic and these defects can be easily repaired if the phase-shifter 3 has not yet been formed on the shield layer 2.

After formation of the phase-shifter 3, defective portions of the substrate are often required to be repaired such that the extra portion 2a is removed and the missing portion 2b is supplemented or filled. A method of repairing defective portions is next explained referring to FIGS. 5(a) through 5(d).

Figure 5A:
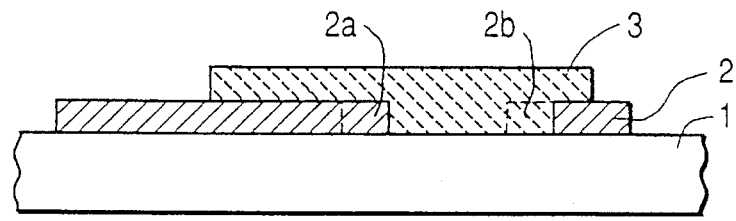
FIGS. 5(a) to 5(d) show a cross sectional view of the reticle with phase-shifters during the repair process in sequential steps, in which the reticle having defects such as in FIG. 4(b) is repaired (first embodiment)
Figure 5B:
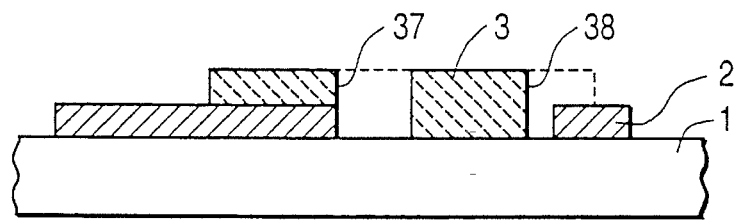

FIGS. 5(a) to 5(d) show a cross sectional view at sequential steps of the repair along line A—A in FIG. 4(b). FIG. 5(a) shows a cross section at an initial stage before the repair process, in which defective portions 2a and 2b in the shield layer 2 are shown by dashed lines. First as shown in FIG. 5(b), the portion of the phase-shifter 3 lying on the extra portion 2a and the portion 2a of the shield layer are removed by a sputter-and-etch method using the previously explained FIB apparatus of FIG. 3 forming an opening 37. Thereafter the phase-shifter portion burying or covering the void portion 2b and the neighboring or missing portion on the shield layer 2 are removed using the same apparatus forming an opening 38.

Figure 1:
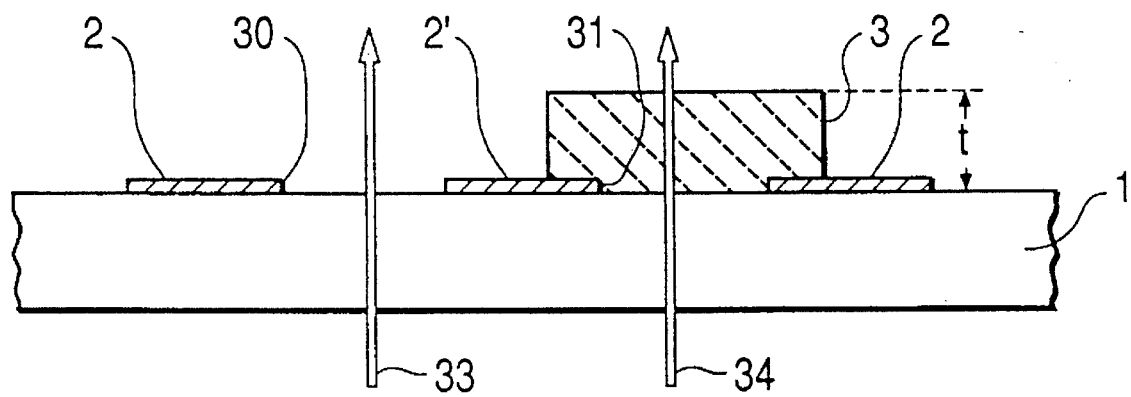
FIG. 1 shows a cross sectional view of a reticle with the phase-shifters of the prior art, in which a deposited (hereinafter called a positive type) phase-shifter is formed on a reticle substrate.
Figure 2:
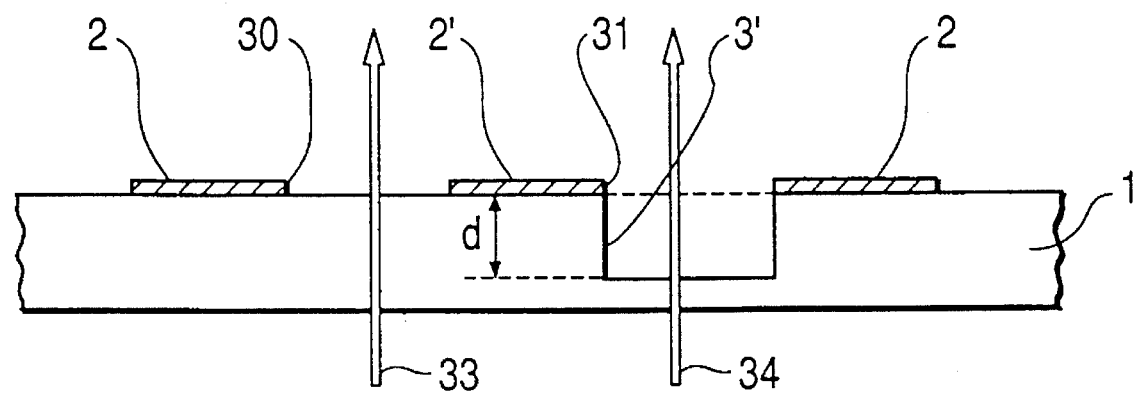
FIG. 2 shows a cross sectional view of a reticle with the phase-shifters of the prior art, in which a grooved (hereinafter called a negative type) phase-shifter is formed in a reticle substrate.
Figure 3:
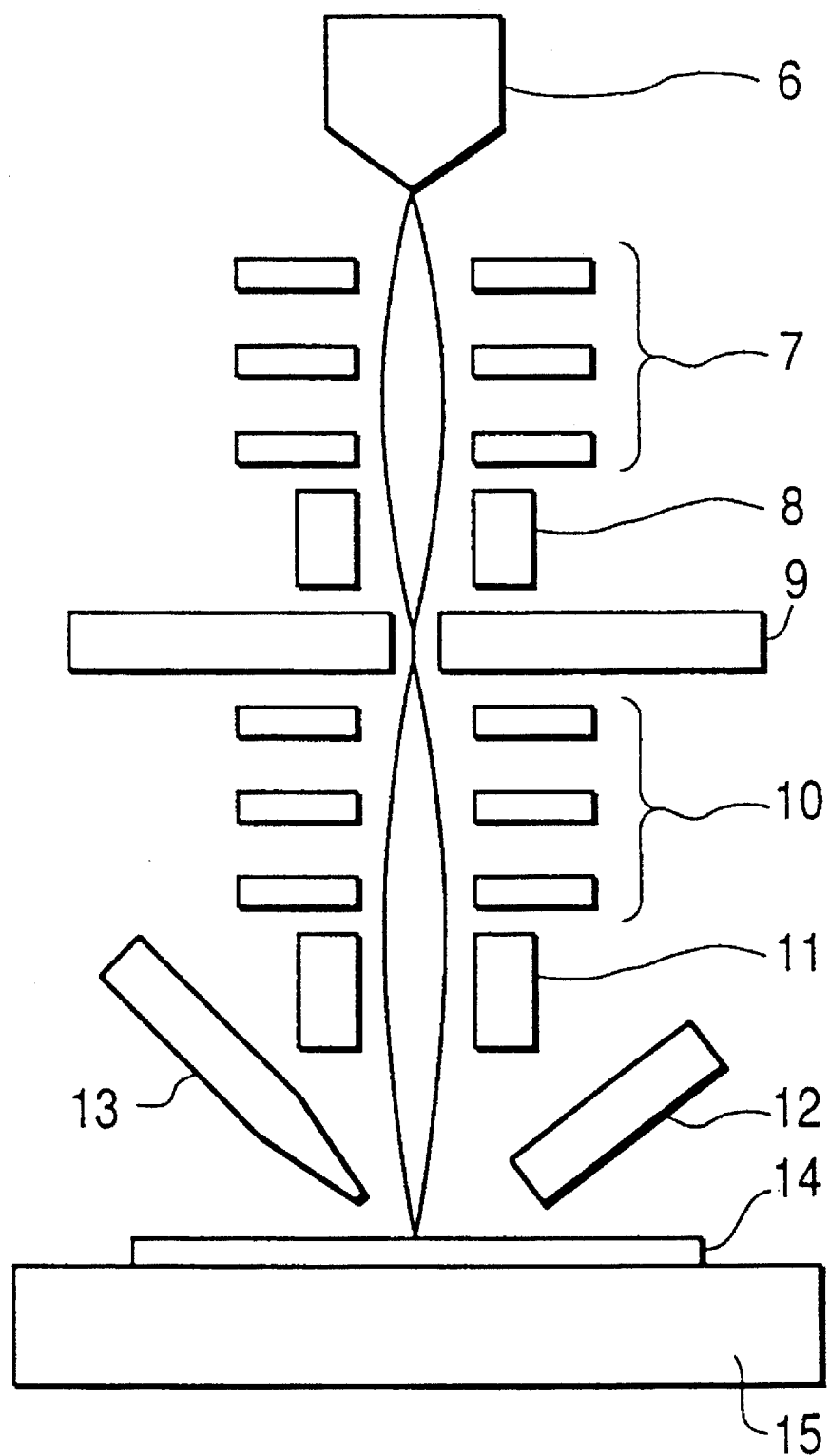
FIG. 3 shows a schematic cross section of a focused ion beam (FIB) apparatus used in fabricating a reticle with the phase-shifters of the present invention.
Figure 5C:
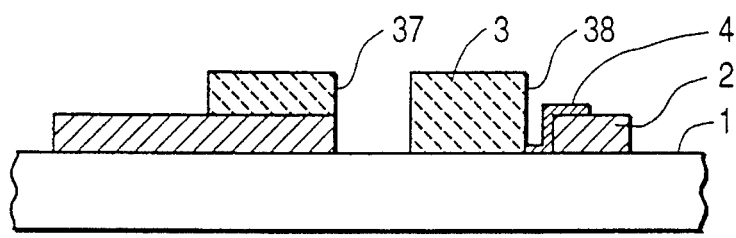

Next, the process of repair involves injecting a tungsten-hexacarbonyl [W(CO)$_6$] gas through a gas injection gun 13 in the FIB apparatus of FIG. 3 into the opening 38, a tungsten layer 4 is deposited as shown in FIG. 5(c).

Figure 5D:
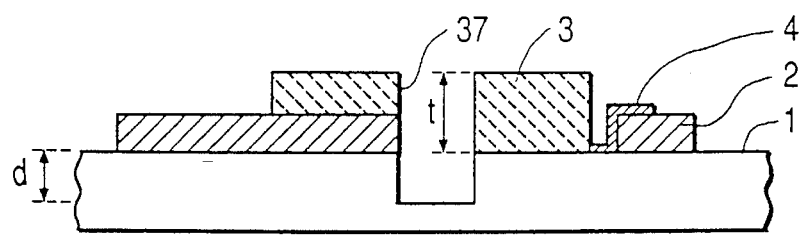

Next, the exposed surface of the reticle substrate 1 in the opening 37 is subjected to a sputter-and-etch process using the FIB apparatus, resulting in forming a groove having a depth d as shown in FIG. 5(d).

The necessary depth amount d is determined according to the following equations;

$$(nd/\lambda)-(d/\lambda)=(1+2m)/2,$$

or $$d=\lambda(1+2m)/2(n-1), \tag{1}$$

where n is a refractive index of the substrate material, $\lambda$ is a wavelength of light used in the stepper, and m is an integer, such as 0, 1, 2, ...

The above equations are used for the depth of the groove type phase-shifter (negative type phase-shifter). However, similar equations are used for a thickness t of the deposited phase-shifter (positive type phase-shifter), in which depth d is replaced by thickness t and refractive index n is used for the material of the deposited phase-shifter.

By calculation, the depth d is given as about 3900 angstroms for a quartz or glass substrate, which is substantially equal to a thickness t of the positive type deposited SiO$_2$ phase-shifter.

However, thickness t and depth d of the phase-shifters of the present invention are not restricted to the amount specified by the equation. Different or varying amounts of thickness or depth for phase-shifters may be effective to improve the formed pattern on an object.

(2) Second Embodiment

Figure 6A:
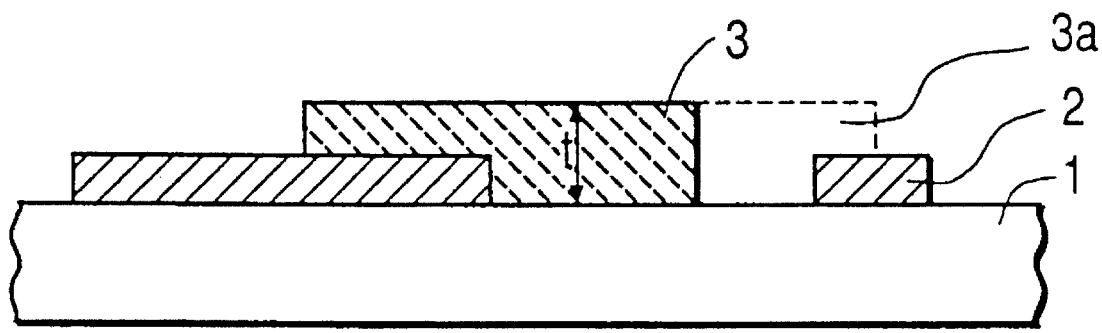
FIGS. 6(a) and 6(b) show a cross sectional view of a reticle with positive type phase-shifters, and the reticle having a defect is shown in FIG. 6(a), and the reticle repaired is shown in FIG. 6(b) (second embodiment)
Figure 6B:
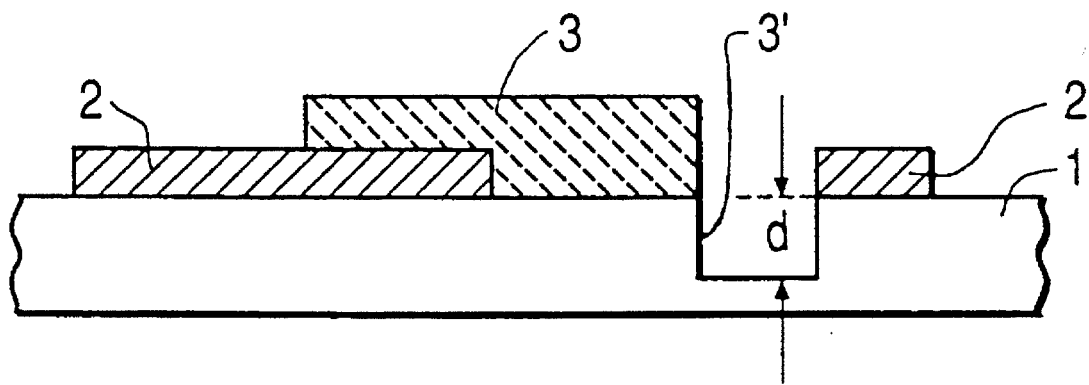

Next, a second embodiment of the present invention is explained with respect to FIGS. 6(a) and 6(b). FIG. 6(a) is a cross sectional view of a reticle with phase-shifters of a positive type, in which a phase-shifter 3 includes a defect of missing portion 3a. A thickness t of the phase shifter 3 is determined by the above modified calculation using equation (1). In the actual embodiment of FIG. 6(a), since the SiO$_2$ layer is used as the phase-shifter 3, in this case, the thickness t is about 3900 angstroms for the refractive index of SiO$_2$.

In order to repair the defect portion 3a, it is difficult to deposit a SiO$_2$ layer using the FIB apparatus, because the required thickness is too large and the deposited layer is not transparent. In accordance with the present invention, the defect portion 3a is repaired by forming a groove having a depth d, which means a negative type phase shifter 3', is grooved into the reticle substrate 1 as shown in FIG. 6(b). Thus, a second grooved phase-shifter is formed on an adjacent side to the first deposited phase-shifter which is defective. The depth d is provided by the previous equation (1). The negative type phase-shifter 3' can be formed by a sputter-and-etch process utilizing the FIB apparatus.

Figure 7A:
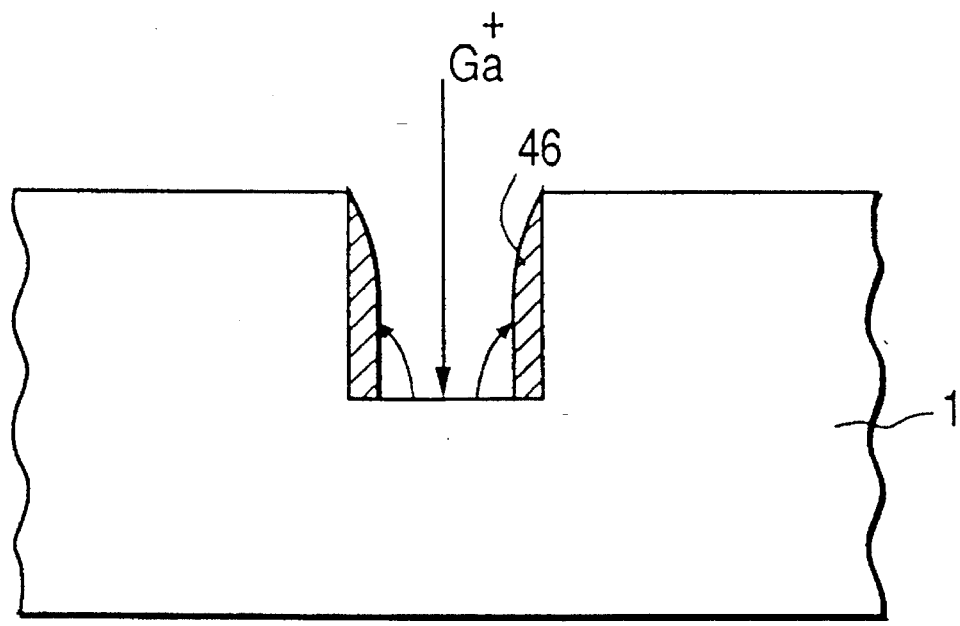
FIGS. 7(a) and 7(b) show a cross sectional view of an enlarged groove for explaining or illustrating the repairing method of the groove in accordance with the present invention.

In forming the groove, it is preferable that the sidewall and the bottom surface of the groove are respectively as vertical and parallel to the substrate surface as possible. FIG. 7(a) shows an enlarged cross sectional view of the grooved portion 46 only, where the groove shows rather a sharp trench shape having, for example, a width of about 0.2 to 0.4 μm and a depth of about 0.39 μm. However, when Ga ions are irradiated into the groove formed in the substrate, the substrate material such as quartz or glass is sputtered from the substrate and the sputtered material deposits on the sidewall of the groove 46 as shown in FIG. 7(a) making the trench shape less sharp.

Figure 7B:
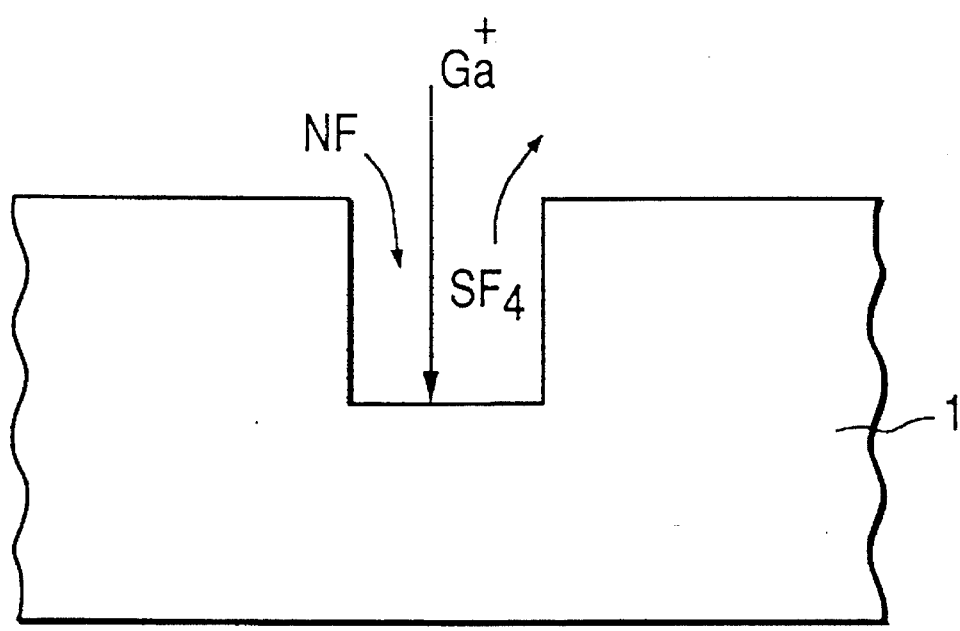

In the embodiment as shown in FIG. 7(b), it is found that a gas selected among the group of carbon tetrafluoride gas (CF$_4$), nitrogen fluoride gas (NF$_3$), fluorine gas (F$_2$), sulfur fluoride gas (SF$_6$), hydrogen fluoride gas (HF), and chlorine gas (Cl$_2$), is injected from the gas injection gun 13 in the FIB apparatus. The gas combines with the substrate material and the object is to remove the substrate material when it is in a volatile silicon compound form such as silicon fluoride (SiF$_4$). This method prevents the substrate material from depositing on the sidewall of the groove.

(3) Third Embodiment

Figure 8A:
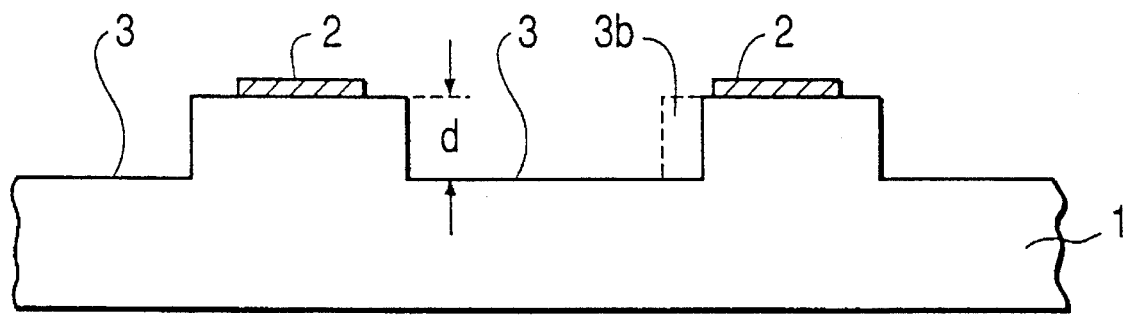
FIGS. 8(a) and 8(b) show a cross sectional view of a reticle with negative type phase-shifters, and the reticle having a defect is shown in FIG. 8(a), and the reticle repaired is shown in FIG. 8(b) (third embodiment)
Figure 8B:
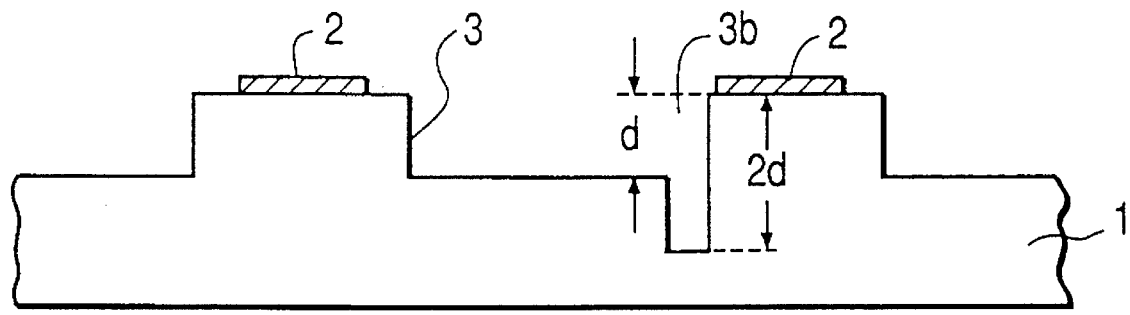

A third embodiment of the present invention is explained by referring to FIGS. 8(a) and 8(b). FIG. 8(a) shows a cross sectional view of a reticle with phase-shifters, in which negative type phase-shifters 3 are formed in a reticle substrate 1 between shield layers 2. The phase-shifter 3 has a defective portion 3b, which should not have been removed to have formed a correct phase-shifter pattern.

Since the process of depositing the substrate material (glass) into the defect void or missing portion 3b and burying or filling the void portion is difficult because of a large depth and lack of transparency of the filling material it has been found that, when an additional negative type phase-shifter is added under the void portion 3b, it has the same effect as the void or missing portion was buried or filled with deposited material. The depth of the defect portion is increased to 2d, which is twice the normal phase-shifter depth d. The depth 2d means that light traveling the distance 2d receives a phase-shift of one full wavelength (2π phase-shift), and therefore, it shows the same characteristic as if no phase-shifter is formed at the void portion 3b.

(4) Fourth Embodiment

Figure 9A:
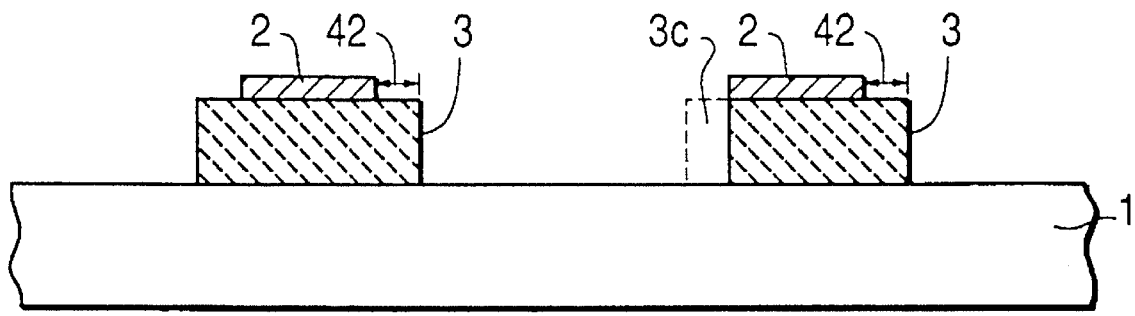
FIGS. 9(a) and 9(b) show a cross sectional view of a reticle with positive type phase-shifters in which phase-shifters are formed on a substrate and shield layer is deposited thereon, and the reticle having a defect is shown in FIG. 9(a), and the reticle repaired is shown in FIG. 9(b) (fourth embodiment)
Figure 9B:
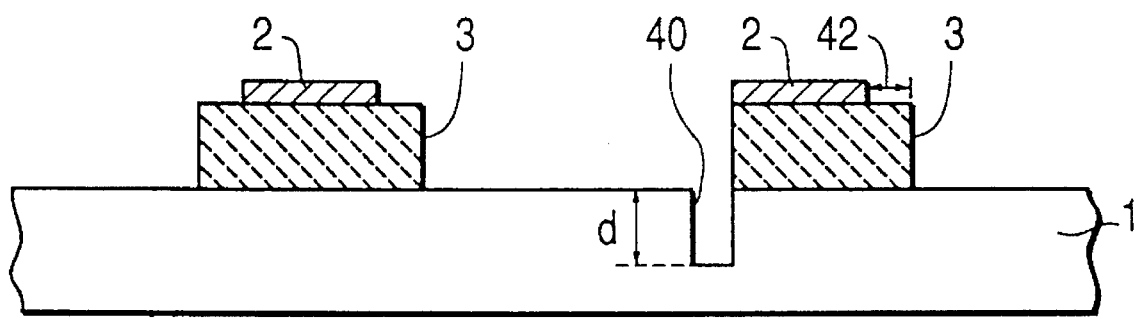

A fourth embodiment of the present invention is explained referring to FIGS. 9(a) and 9(b). FIG. 9(a) shows a cross sectional view of a reticle with phase-shifters, in which positive type phase-shifters 3 are formed on a reticle substrate 1, and a shield layer 2 of Cr is deposited thereon. The phase-shifter 3 has a shoulder portion 42 on both sides of the shield layer 2, and one shoulder portion has a defective portion 3c, which should not have been removed for the correct phase-shifter pattern to be formed.

Since processes of depositing the substrate material such as SiO$_2$ onto the defect void portion 3c and burying the void portion, are difficult because of the large thickness and lack of transparency of the deposited layer, it has been found that, when a negative type phase-shifter, namely, a groove 40 is formed under the void or missing portion 3c in FIG. 9(b), it has the same effect as if the void portion was repaired with the deposited phase-shifter. Since the depth of the groove to be formed is d, light traveling through the groove of distance d receives a phase-shift of π or half the wavelength of light which is the same as that caused by the phase-shifter 3.

(5) Fifth Embodiment

Figure 10:
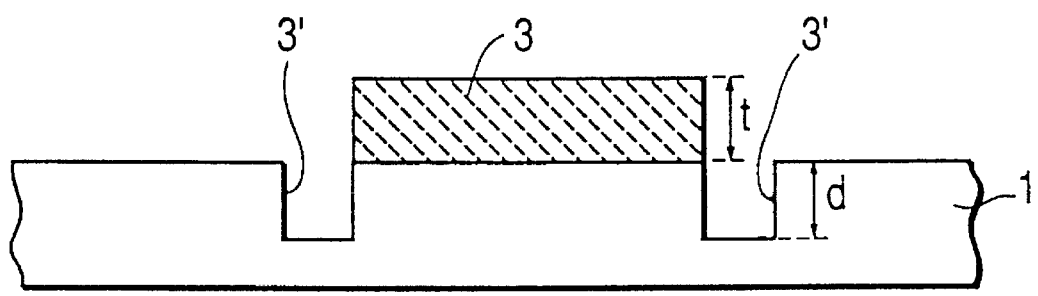
FIG. 10 shows a cross sectional view of a reticle with positive and negative type phase-shifters, in which both types of phase-shifters are formed, and no shield layer is used (fifth embodiment).

Throughout the embodiments described above, all reticles include a patterned shield layer. However, a reticle of the present invention is not limited to a reticle containing a patterned shield layer. The present invention may be applied to a reticle structure without a shield layer. FIG. 10 shows a cross sectional view of a reticle with phase-shifters, in which positive and negative type phase-shifters are formed and no shield layer is used.

A positive type phase-shifter 3 is formed on a reticle substrate 1 and a negative type phase-shifter 3' is formed on both sides of the positive type phase-shifter 3 without a shield layer.

The present invention may be embodied in other specific forms without departing from the spirit or essential characteristics thereof. The presently disclosed embodiments are, therefore, to be considered in all respects as illustrative and not restrictive. The scope of the invention is indicated by the appended claims, rather than the foregoing description, and all changes which come within the meaning and range of equivalence of the claims are, therefore, to be embraced therein.

What is claimed is:

1. A method of fabricating a reticle for projecting a fine pattern onto an object surface, the reticle comprising a transparent substrate having a light transparent area of plural light transmissive regions, the regions producing relative phase differences of incident light transmitted therethrough as a function of relative differences in the respective thicknesses of the regions, the method comprising the steps of:

(a) depositing a transparent layer on said substrate, the thickness of the transparent layer being selected so as to produce a desired phase difference between light transmitted through said substrate in a light transmissive region thereof without said transparent layer and light transmitted through said substrate in a light transmissive region thereof with said transparent layer thereon;

(b) selectively removing a portion of said transparent layer, thereby defining, in the light transparent area, a first light transmissive region having both said substrate and said transparent layer and a second light transmissive region having said substrate only; and (c) selectively removing a portion of said substrate so as to form a groove of a selected depth in said substrate, thereby defining, in the light transparent area, a third light transmissive region corresponding to said groove and wherein light transmitted through said third light transmissive region is in substantially the same phase as light transmitted through said first light transmissive region.

2. A method of fabricating a reticle as recited in claim 1, wherein the relative, different thicknesses of the regions are selected to produce corresponding, relative phase differences substantially equal to a half wavelength of said light.

3. A method of fabricating a reticle as recited in claim 1, wherein said first transparent region and said third transparent region are arranged side by side so as to have a common edge.

4. A method of fabricating a reticle as recited in claim 3, wherein, in the event that step (b) produces a defective portion by excess removal of said transparent layer, said third transparent region in step (c) is formed for an area corresponding to said defective portion.

5. A method of fabricating a reticle as recited in claim 3, wherein said step (c) further comprises the substeps of:

placing said reticle into a focused ion beam apparatus, the apparatus being provided with a gas injection gun;

injecting a gas comprising halogen onto said defective portion on the substrate; and irradiating an ion beam on the area of said defective portion thereby to remove sufficient material of the substrate in that area and form said groove of the third light transmissive region.

6. A method of fabricating a reticle as recited in claim 5, wherein said halogen comprising gas is selected from the group of carbon tetrafluoride gas ($CF_4$), nitrogen fluoride gas ($NF_3$), fluorine gas ($F_2$), sulfur fluoride gas ($SF_6$), hydrogen fluoride gas (HF), and chlorine gas ($Cl_2$).

7. A method of fabricating a reticle as recited in claim 1, wherein said transparent layer is of silicon dioxide ($SiO_2$).

8. A method of fabricating a reticle as recited in claim 1, said method comprising the advance substeps of depositing a metal layer on said substrate and selectively removing portions of said metal layer to form a patterned light shield layer and remaining portions of the substrate being exposed, the transparent layer being deposited at least on the exposed portions of the substrate.

9. A method of fabricating a reticle for projecting a fine pattern onto an object surface, the reticle comprising a transparent substrate having a light transparent area of plural light transmissive regions, the regions producing relative phase differences of incident light transmitted therethrough as a function of relative differences in the respective thicknesses of the regions, the method comprising the steps of:

(a) forming a first groove in said substrate and thereby defining a first light transmissive region of the light transparent area contiguous the first groove, the depth of the first groove being selected so as to produce a desired phase difference between light transmitted through said first light transmissive region and light transmitted through said substrate in the portion thereof defined by said first groove; and (b) forming a second groove in said first groove, thereby defining a second transparent region corresponding to the remaining area of said first groove and a third transparent region corresponding to the area of said second groove, the depth of the second groove being selected such that light transmitted through said third transparent region is in the same phase as light transmitted through said first transparent region.

10. A method of fabricating a reticle as recited in claim 9, wherein the relative, different thicknesses of the regions are selected to produce corresponding, relative phase differences substantially equal to a half wavelength of said light.

11. A method of fabricating a reticle as recited in claim 9, wherein said first transparent region and said third transparent region are arranged side by side so as to have a common edge.

12. A method of fabricating a reticle as recited in claim 11, wherein, in the event that step (a) produces a defective portion between said first and second regions by excess removal of said first transparent region, said third transparent region in step (b) is formed for an area corresponding to said defective portion.

13. A method of fabricating a reticle as recited in claim 11, wherein said step (b) further comprises the substeps of:

placing said reticle into a focused ion beam apparatus, the apparatus being provided with a gas injection gun;

injecting a gas comprising halogen onto said defective portion on the substrate; and irradiating an ion beam on the area of said defective portion thereby to remove sufficient material of the substrate in that area and form said second groove of the third light transmissive region.

14. A method of fabricating a reticle as recited in claim 13, wherein said halogen comprising gas is selected from the group of carbon tetrafluoride gas ($CF_4$), nitrogen fluoride gas ($NF_3$), fluorine gas ($F_2$), sulfur fluoride gas ($SF_6$), hydrogen fluoride gas (HF), and chlorine gas ($Cl_2$).

15. A method of fabricating a reticle as recited in claim 9, said method comprising the advance substeps of depositing a metal layer on said substrate and selectively removing portions of said metal layer to form a patterned light shield layer and remaining portions of the substrate being exposed, the transparent layer being deposited at least on the exposed portions of the substrate.

16. A method of fabricating a reticle for projecting a fine pattern onto an object surface, the reticle comprising a transparent substrate having a light transparent area of plural light transmissive regions, the regions producing relative phase differences of incident light transmitted therethrough relative differences in the respective thicknesses of the regions, the method comprising the steps of:

(a) depositing a transparent layer on said substrate, the thickness of the transparent layer being selected so as to produce a desired phase difference between light transmitted through said substrate in a light transmissive region thereof without said transparent layer and light transmitted through said substrate in a light transmissive region thereof with said transparent layer thereon;

(b) selectively removing a portion of said transparent layer in accordance with a prescribed pattern and thereby to define, in the light transparent area and in accordance with the prescribed pattern, a first light transmissive region having both said substrate and said transparent layer and a second light transmissive region having said substrate only; and (c) where an amount of the transparent layer beyond that defined by the prescribed pattern is removed but which was to have been retained, constituting a defective transparent layer area portion, selectively removing a portion of said substrate, corresponding to the defective transparent layer area portion, so as to form a groove of a selected depth in said substrate and thereby define, in the light transparent area, a third light transmissive region corresponding to said groove and wherein light transmitted through said third light transmissive region is in substantially the same phase as light transmitted through said first light transmissive region.

17. A method of fabricating a reticle for projecting a fine pattern onto an object surface, the reticle comprising a transparent substrate having a light transparent area of plural light transmissive regions, the regions producing relative phase differences of incident light transmitted therethrough as a function of relative differences in the respective thicknesses of the regions, the method comprising the steps of:

(a) forming a first groove in said substrate in accordance with a prescribed pattern and thereby defining a first light transmissive region of the light transparent area contiguous the first groove, the depth of the first groove being selected so as to produce a desired phase difference between light transmitted through said first light transmissive region and light transmitted through said substrate in the portion thereof defined by said first groove, removal of any amount of the substrate exceeding the prescribed pattern producing a defective substrate portion; and (b) forming a second groove in said first groove, thereby defining a second transparent region corresponding to the remaining area of said first groove and a third transparent region corresponding to the area of said second groove and thereby to the defective portion of the substrate, the depth of the second groove being selected such that light transmitted through said third transparent region is in the same phase as light transmitted through said first transparent region.

* * * * *

UNITED STATES PATENT AND TRADEMARK OFFICE
CERTIFICATE OF CORRECTION

PATENT NO. : 5,514,498
DATED : May 7, 1996
INVENTOR(S) : NAKAGAWA

It is certified that error appears in the above-indentified patent and that said Letters Patent is hereby corrected as shown below:

Col. 2, line 57, change "a few" to --(a few--.

Signed and Sealed this

Twenty-seventh Day of August, 1996

Attest:

BRUCE LEHMAN

*Attesting Officer*  *Commissioner of Patents and Trademarks*